Feb. 27, 1968 R. E. LOVELACE 3,371,286

STABILIZED DIRECT-COUPLED PUSH-PULL AMPLIFIER

Filed Aug. 27, 1964

INVENTOR.
RALPH E. LOVELACE
BY
Shenier & O'Connor
ATTORNEYS

United States Patent Office 3,371,286
Patented Feb. 27, 1968

3,371,286
STABILIZED DIRECT-COUPLED PUSH-PULL AMPLIFIER

Ralph E. Lovelace, East Norwalk, Conn., assignor to United Aircraft Corporation, East Hartford, Conn., a corporation of Delaware Filed Aug. 27, 1964, Ser. No. 392,457
12 Claims. (Cl. 330—123)

ABSTRACT OF THE DISCLOSURE

In general my invention contemplates the provision of a push-pull output stage comprising a pair of transistors having grounded emitters. The output transistors are connected to a center-tapped load winding having some inherent resistance in each of its two halves. I provide a control voltage in accordance with the sum of the voltages at the collectors of the output transistors. Since the winding does have some resistance a net voltage appears proportional to the total flow of direct current through the output transistors. The output transistors are normally biased at cut-off for Class B operation. If the control voltage, indicative of the total collector current of the two output transistors, decreases below a certain minimum value, then both output transistors are biased into conduction sufficiently that the control voltage is maintained at such minimum value. Effectively my circuit linearizes the cut-off characteristics of the output transistors over an extended range of currents so that the crossover gain has the proper value.

My invention relates to push-pull amplifiers and more particularly to stabilized direct-coupled push-pull amplifiers which operate substantially Class B.

It is usual to provide a slight forward bias for a push-pull output stage so that a small but significant quiescent current flow is present in order to reduce crossover distortion. If the quiescent current is too small, then the crossover gain becomes less than desired; and if the quiescent current is too large, then the crossover gain becomes greater than desired. Generally the stabilization is marginal, since small emitter resistors are employed. In such circuits employing marginal stabilization the efficiency is high, since little negative feedback results because of the small emitter resistance values.

If it is desired to achieve a wider margin of stabilization then larger resistors must be employed in series with the emitters. However crossover distortion may increase due to excessive crossover gain. Furthermore, in achieving a higher margin of stability, the efficiency of the circuit decreases because of the greater negative feedback and greater power loss in the emitter resistances.

This negative feedback may be reduced by shunting the emitter resistances with capacitors having large capacitance values. However, in such event the circuit is no longer direct-coupled, is frequency sensitive, and requires appreciable additional space to accommodate the by-pass capacitors. Furthermore, for large signals, the amplifier operates Class C instead of Class B as desired.

One object of my invention is to provide a stabilized push-pull amplifier which is direct-coupled and employs no bulky capacitors.

Another object of my invention is to provide a direct-coupled push-pull amplifier in which a wide stabilization margin is achieved without the provision of power dissipating emitter resistances.

A further object of my invention is to provide a stabilized direct-coupled amplifier which operates substantially Class B and never operates Class C.

Other and further objects of my invention will appear from the following description.

In the accompanying drawings which form part of the instant specification and which are to be read in conjunction therewith, FIGURE 1 is a schematic view showing an embodiment of my invention.

Figure 1:
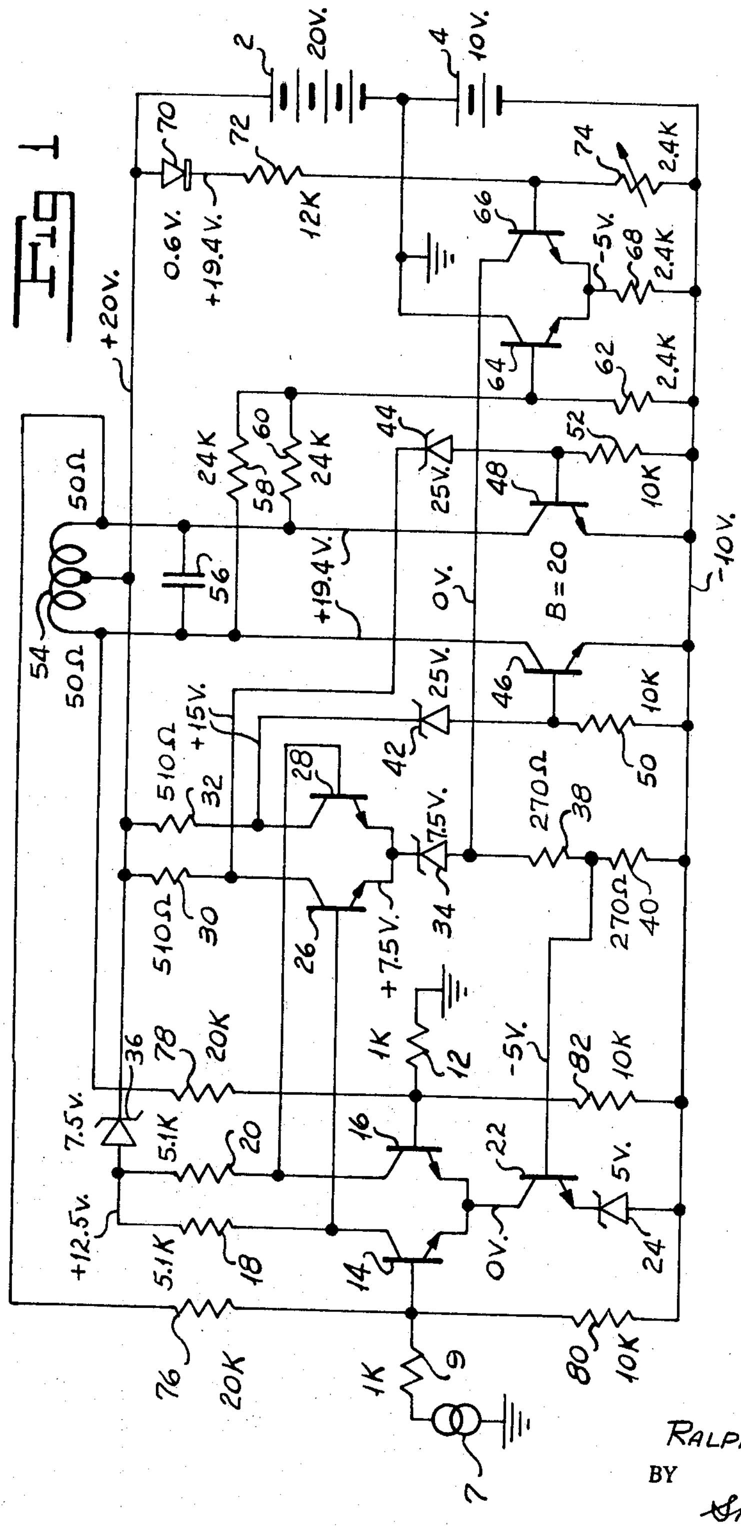

Referring now more particularly to FIGURE 1 of the drawings, the positive terminal of a 10 volt battery 4 and the negative terminal of a 20 volt battery 2 are grounded. One terminal of an input source 7 is grounded and the other terminal thereof is coupled through a 1 kilohm resistor 9 to the base of a transistor 14. A 1K resistor 12 connects the base of a transistor 16 to ground. The positive terminal of battery 2 is connected to the cathode of a 7.5 Zener diode 36, the anode of which is coupled through respective 5.1K resistors 18 and 20 to the collectors of transistors 14 and 16. The emitters of transistors 14 and 16 are coupled to the collector of a transistor 22, the emitter of which is connected backwardly through a 5 volt Zener diode 24 to the negative terminal of battery 4. The collectors of transistors 14 and 16 are coupled to the respective bases of transistors 26 and 28. The positive terminal of battery 2 is coupled through respective 510 ohm resistors 30 and 32 to the collectors of transistors 26 and 28. The emitters of transistors 26 and 28 are connected to the cathode of a 7.5 volt Zener diode 34. The anode of Zener diode 34 is connected serially through 270 ohm resistors 38 and 40 to the negative terminal of battery 4. The junction of resistors 38 and 40 is connected to the base of transistor 22. The collectors of transistors 28 and 26 are coupled backwardly through respective 25 volt Zener diodes 42 and 44 to the bases of transistors 46 and 48, which in turn are coupled through respective 10K resistors 50 and 52 to the negative terminal of battery 4. The emitters of transistors 46 and 48 are connected to the negative terminal of battery 4. The positive terminal of battery 2 is connected to the center tap of a winding 54, each half of which has a resistance of 50 ohms. Winding 54 may comprise the variable phase winding of a servomotor and is shunted by a capacitor 56 to form a tuned circuit exhibiting parallel resonance at the frequency of source 7. The collectors of transistors 46 and 48 are connected to the respective terminals of winding 54 and are also coupled through respective 24K summing resistors 58 and 60 to the base of a transistor 64 which in turn is coupled through a 2.4K resistor 62 to the negative terminal of battery 4. The emitters of transistor 64 and of a transistor 66 are coupled through a 2.4K resistor 68 to the negative terminal of battery 4. The collector of transistor 64 is grounded; and the collector of transistor 66 is connected to the anode of Zener diode 34. The positive terminal of battery 2 is connected to the anode of a silicon diode 70 which exhibits a forward drop of 0.6 volt. The cathode of diode 70 is coupled through a 12K resistor 72 to the base of transistor 66 which in turn is coupled through a variable resistor 74 having a nominal value of 2.4K to the negative terminal of battery 4. The collectors of transistors 48 and 46 are coupled through respective 20K resistors 76 and 78 to the bases of transistors 14 and 16 which in turn are coupled through 10K resistors 80 and 82 to the negative terminal of battery 4.

Transistors 14 and 16 form a balanced emitter-coupled differential amplifier. It is assumed that source 7 has zero internal resistance. If, however, source 7 does have some internal resistance then the value of resistor 9 may be accordingly reduced so that the internal resistance of source 7 when augmented by resistor 9 yields an equivalent series resistance of 1K. The nominal potential of the base and of the emitter of transistor 22 is −5 volts. The bases and the emitters of transistors 14 and 16 are nominally at ground potential. The nominal potential of the bases and the emitters of transistors 26 and 28 is +7.5 volts. The nominal potential of the collectors of transistors 26 and 28 is +15 volts; and the nominal potential of the bases of transistors 46 and 48 is −10 volts. The nominal potential of the bases and the emitters of transistors 64 and 66 is −5 volts; and the collector of transistor 66 is nominally at ground potential.

In the quiescent condition, with no input from source 7, 10 milliamperes flows through each of resistors 30 and 32. The current flow through resistors 38 and 40 is 18 ma. The collector current flow of each of transistors 64 and 66 is 1 ma. so that 2 ma. flows through resistor 68. Thus 19 ma. flows through Zener diode 34. Accordingly, each of transistors 26 and 28 have a collector current of 9.5 ma. Of the 10 ma. current flowing through each of resistors 30 and 32 then, 0.5 ma. flows through each of Zener diodes 42 and 44 to the bases of transistors 46 and 48. Each of these transistors is assumed to have a current gain beta of twenty. Accordingly the collector current flow of each of transistors 46 and 48 is 10 ma.

The feedback from the emitters of transistors 26 and 28 through Zener diode 34 and resistors 38 and 40 to the base of transistor 22 maintains the collector of transistor 66 at ground potential. Suppose the collector of transistor 66 rises above ground potential. This increase in potential is coupled through resistors 38 and 40 to the base of transistor 22, causing an increased collector current. The increased collector current of transistor 22 produces a corresponding increase in the collector currents of transistors 14 and 16. The potentials at the collectors of transistors 14 and 16 decrease, causing a reduction in potential of the emitters and bases of transistors 26 and 28, which reduction in potential is coupled through Zener diode 34 to the collector of transistor 66.

The current flow through each of resistors 58, 60, 76, and 78 is 1 ma. Accordingly the total current through each of the two halves of winding 54 is 12 ma. This causes a drop of 0.6 volt across each of the winding halves so that the potential of the collectors of transistors 46 and 48 is +19.4 volts which is the same as the potential existing at the cathode of silicon diode 70. Diode 70 thus provides a reference voltage for establishing the quiescent current through transistors 46 and 48.

Assume that drift in the characteristics of transistors 46 and 48 increases the collector current. This produces a decrease in potential at the collector of transistors 46 and 48 which decreases the potential at the base of transistor 64, reducing its collector current. Since transistors 64 and 66 form an emitter-coupled differential amplifier, any reduction in the collector current of transistor 64 occasions a corresponding increase in the collector current of transistor 66 so that the total current through emitter resistor 68 remains substantially constant. The increase in collector current of transistor 66 increases the current flow through the emitters and hence the collectors of transistors 26 and 28. The potential at the collectors of transistors 26 and 28 decreases which occasions a decrease in the potential at the bases of transistors 46 and 48 and a corresponding decrease in their collector currents. When the collector current of transistor 64 is zero, that of transistor 66 is 2 ma.; and the total base current to transistors 46 and 48 is zero. When the collector current of transistor 64 is 2 ma., that of transistor 66 is zero; and the total base current to transistors 46 and 48 is 2 ma. Thus the total base current of the output transistors is equal to the collector current of transistor 64. The collector current of transistor 64 is variable between 0 and 2 ma. which permits of the variation in the total collector current flow of transistors 46 and 48 between 0 and 40 ma. This affords an ample region for stabilizing the total quiescent current flow of output transistors 46 and 48 at 20 ma. The total quiescent collector current of transistors 46 and 48 may be set at any desired value between 0 and 40 ma. by adjustment of resistor 74.

Resistors 76, 78, 80, and 82 have no effect upon the quiescent collector current of the output transistors but do provide a differential feedback to ensure that each of output transistors 46 and 48 pass substantially equal quiescent currents. For example, assume that the current of transistor 46 increases and that of transistor 48 decreases, producing a decrease in the collector potential of transistor 46 and an increase in the collector potential of transistor 48. This results in an increase in the collector potential of transistor 16 and a decrease in the collector potential of transistor 14, which in turn produces a decrease in the collector potential of transistor 28 and an increase in the collector potential of transistor 26. The increased collector potential of transistor 26 increases the base current flow and hence the collector current flow of transistor 48; and the decrease in collector potential of transistor 28 results in a decrease in the base current and hence the collector current of transistor 46. Thus the negative feedback from the collector of transistors 46 and 48 to the bases of transistors 14 and 16 equalizes the quiescent collector currents of transistors 46 and 48. It will be noted that the differential amplifier comprising transistors 14 and 16 does not respond to changes in the total quiescent collector current of transistors 46 and 48. A symmetrical increase or decrease in the base potential of transistors 14 and 16 is absorbed by corresponding variations in the collector voltage of transistor 22; and no change results in the current flow through transistors 14 and 16.

Figure 2:
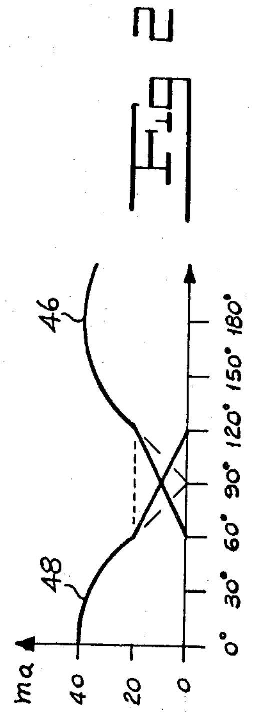
FIGURE 2 shows the variation in the collector currents of the two output transistors for a half cycle of operation centered about a zero crossing.

Referring now to FIGURE 2, I have shown the variation in collector currents of the output transistors 46 and 48 in the presence of a small input signal which, however, is of sufficient magnitude to produce a peak current flow of 40 ma. through each half of winding 54. Assume at 0° that source 7 provides a maximum positive output, which provides a minimum voltage at the collector of transistor 14, a maximum voltage at the collector of transistor 26, and a maximum current of 40 ma. through transistor 48. Transistor 64 is cut-off; transistor 66 passes 2 ma.; and the net bias current to the output transistors is zero. At 60° the collector current of transistor 48 is 20 ma.; and that of transistor 46 is zero. Again, transistor 64 is cut off; transistor 66 passes 2 ma.; and the net bias current to the output transistors is zero. Between 60° and 120° the collector current of transistor 48 drops in a substantially linear fashion from 20 ma. to zero while at the same time the collector current of transistor 46 increases in a substantially linear fashion from zero to 20 ma. It will be noted that the total collector current of the output transistors, as indicated by the dotted line, remains constant at 20 ma. from 60° to 120°. The net current which produces flux in center-tapped motor winding 54 comprises the difference between the collector currents of the output transistors. It will be noted that between 60° and 90° the net current to winding 54 decreases in a substantially linear fashion from 20 ma. to zero while from 90° to 120° the net current flow through winding 54 increases in a substantially linear fashion from zero to 20 ma., as indicated by the dashed lines. At 90° where the input signal from source 7 is zero the circuit is in its quiescent condition where the collector current flow of each of the output transistors is 10 ma. From 120° to 180° transistor 64 is cut off, transistor 66 passes 2 ma.; and the net bias current to the output transistors is zero. It will be noted from the solid curves that the resultant cut-off characteristics of the output transistors are linearized over the range from zero to 20 ma.

Zener diode 34 is provided so that each of transistors 64 and 66 sustain 5 volts and are thus maintained at identical operating points with their collectors substantially at ground potential. This symmetry minimizes residual drift in the differential amplifier. Summing resistors 58 and 60 are provided so that the induced voltages in winding 54 cancel one another by virtue of the center-tapped connection.

Figure 3:
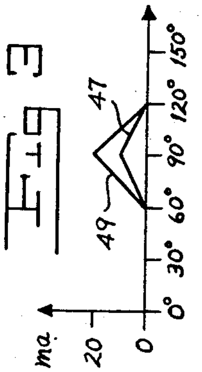
FIGURE 3 shows the pulses of bias current adjacent a zero crossing.

Referring now to FIGURE 3, there is shown the bias collector current components in the output transistors as distinguished from the total currents shown by the solid lines of FIGURE 2 and from the net motor winding currents shown by the dashed lines of FIGURE 2. Between 60° and 90° the collector current of transistor 64 increases substantially linearly from zero to 1 ma.; and between 90° and 120° the collector current of transistor 64 decreases linearly from 1 ma. to zero. During these intervals the bias collector current of each of the output transistors, as indicated at 47, increases from zero to 10 ma. and then decreases to zero again, while the total bias collector current of both output transistors, as indicated at 49, increases from zero to 20 ma. and then decreases to zero again. These pulses of bias current are of generally triangular wavefrom, occur adjacent zero crossings of the signal from source 7, and periodically drive both output transistors into Class A operation. It will be appreciated that as the amplitude of the input signal is increased the period during which pure Class B operation obtains becomes larger, while the period during which Class A operation obtains becomes smaller. At no time can the circuit operate Class C.

The maximum available base drive for the output transistors is 10 ma. For example, when transistor 26 is cut off the base current flow to transistor 48 is 10 ma.; and when transistor 28 is cut off the base current flow to transistor 46 is 10 ma. Thus the maximum collector current of each output transistor is approximately 200 ma. Driver transistors 26 and 28 sustain a quiescent voltage of 7.5 volts which is appreciably greater than the 5 volt drop across resistors 30 and 32 so that these transistors are not driven to saturation. For example, when transistor 26 is cut off, the current flow through transistor 28 is 20 ma. The voltage drop across resistor 32 is 10 volts; but transistor 28 still sustains 2.5 volts. Accordingly proper operation of the differential amplifier comprising transistors 26 and 28 is maintained at maximum output. Similarly, transistors 14 and 16 in the quiescent condition sustain 7.5 volts while the voltage drop across resistors 18 and 20 is only 5 volts, thus assuring proper operation of this differential amplifier at maximum output.

It will be seen that I have accomplished the objects of my investion. My amplifier is direct coupled. There are no frequency sensitive components other than the center-tapped winding and its tuning capacitor. In my amplifier a high degree of stabilization is secured; and an ample stabilization margin exists. No power dissipating emitter resistances need be provided for the output transistors. My amplifier is substantially free from crossover distortion. My amplifier operates substantially Class B and never operates Class C.

It will be understood that certain features and subcombinations are of utility and may be employed without reference to other features and subcombinations. This is contemplated by and is within the scope of my claims. It is further obvious that various changes may be made in details within the scope of my claims without departing from the spirit of my invention. It is, therefore, to be understood that my invention is not to be limited to the specific details shown and described.

Having thus described my invention, what I claim is:

1. A push-pull amplifier including in combination a pair of amplifying devices, a signal source, means responsive to instantaneous source signals greater than a certain magnitude for driving the devices Class B push-pull, and means responsive to instantaneous source signals less than said certain amplitude for driving the devices Class A push-pull.

2. A push-pull amplifier including in combination a pair of amplifying devices providing output currents, a signal source, means responsive to the source for driving the devices Class B push-pull, and means responsive to instantaneous source signals less than a certain magnitude for increasing the output current of each device.

3. A push-pull amplifier including in combination a pair of amplifying devices providing output currents, means for driving the devices Class B push-pull, means for periodically providing pulses, and means responsive to said pulses for preventing the total output current of the two devices from decreasing below a minimum value which is appreciably greater than zero.

4. A push-pull amplifier including in combination a pair of amplifying devices connected in push-pull, means normally biasing the devices for Class B operation, means for periodically providing pulses, and means responsive to said pulses for biasing the devices into Class A operation.

5. A push-pull amplifier including in combination a pair of current controlling devices connected in push-pull, source of variable amplitude input signal, means responsive to said signal for driving the devices, means providing a first biasing level for which the devices are at cut-off, means providing a second biasing level for which the devices draw appreciable current and means responsive to the current drawn by the devices for varying the bias of the devices solely within the region between the first and second levels irrespective of the amplitude of the input signal.

6. A push-pull amplifier including in combination a differential amplifier providing a pair of outputs, means biasing the differential amplifier for Class A operation, a pair of amplifying devices, means responsive to the pair of outputs for driving the pair of devices in Class B push-pull, a control amplifier having an input and providing an output, means coupling both devices to the input of the control amplifier, and means coupling the output of the control amplifier to the differential amplifier.

7. A push-pull amplifier including in combination a first and a second amplifying device each having an input and a reference terminal and providing an output, a resistive impedance, means coupling both reference terminals to the impedance, a signal source, means coupling the source across the input terminals of the first and second devices, means biasing the first and second devices for Class A operation, a third and a fourth amplifying device, means responsive to the outputs of the first and second devices for driving the third and fourth devices in Class B push-pull, a control amplifier having an input and providing an output, means coupling both the third and fourth devices to the input of the control amplifier, and means coupling the output of the control amplifier to the impedance.

8. A push-pull amplifier including in combination amplifying means having a first and a second and a reference input and providing a first and a second output, the first and second outputs being differentially responsive to the first and second inputs and being cumulatively responsive to the reference input, a signal source, means coupling the source between the first and second inputs, means biasing the amplifying means for Class A operation, a pair of amplifying devices, means responsive to the first and second outputs for driving the devices in Class B push-pull, a control amplifier having an input and providing an output, means coupling both devices to the input of the control amplifier, and means coupling the output of the control amplifier to the reference input.

9. A push-pull amplifier including in combination a first and a second pair of current controlling devices, means connecting the second pair of devices in push-pull, means biasing the first pair of devices for Class A operation, means responsive to the first pair for normally biasing the second pair of devices at cut-off, and means for so controlling the total current drawn by the first pair that the total current drawn by the second pair is always appreciably greater than zero.

10. A push-pull amplifier including in combination a pair of current controlling devices connected in push-pull, means normally biasing the devices at cut-off, a source of an alternating-current signal having two zero crossings per cycle, and means operable in the region adjacent a zero crossing for coupling to the devices an auxiliary bias pulse of generally triangular waveform having a peak amplitude at the zero crossing.

11. A push-pull amplifier including in combination a pair of current controlling devices connected in push-pull, means normally biasing the devices at cut-off, a source of an alternating-current signal having two zero crossings per cycle, and means operable in the region adjacent a zero crossing for coupling an auxiliary bias pulse to the devices.

12. A push-pull amplifier including in combination a pair of current controlling devices connected in push-pull, means normally biasing the devices at cut-off, means for periodically providing pulses, and means responsive to the pulses for biasing both devices into conduction.

References Cited

UNITED STATES PATENTS

| | | | |
|---|---|---|---|
| 2,543,819 | 3/1951 | Williams | 330—139 X |
| 2,761,917 | 9/1956 | Aronson | 330—15 |
| 2,918,630 | 12/1959 | Kiebert | 330—139 X |
| 2,994,832 | 8/1961 | James | 330—29 X |
| 3,206,685 | 9/1965 | Polasek | 330—82 X |
| 3,262,066 | 7/1966 | Trilling | 330—30 X |

FOREIGN PATENTS 884,365 12/1961 Great Britain.

OTHER REFERENCES

High Current Amplifier Drives Hi-Fi Galvanometers, Electronic Design, Nov. 25, 1959, page 76.

ROY LAKE, *Primary Examiner.*

J. B. MULLINS, *Assistant Examiner.*